(12) United States Patent
Zhang et al.

(10) Patent No.: US 7,851,284 B2
(45) Date of Patent: Dec. 14, 2010

(54) METHOD FOR MAKING GAN-BASED HIGH ELECTRON MOBILITY TRANSISTOR

(75) Inventors: An-Ping Zhang, Niskayuna, NY (US); James Kretchmer, Ballston Spa, NY (US); Edmund Kaminsky, Jr., Rexford, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 375 days.

(21) Appl. No.: 11/980,270

(22) Filed: Oct. 30, 2007

(65) Prior Publication Data

US 2008/0124851 A1 May 29, 2008

Related U.S. Application Data

(62) Division of application No. 11/100,672, filed on Apr. 7, 2005.

(51) Int. Cl.
*H01L 21/338* (2006.01)

(52) U.S. Cl. ............. 438/172; 257/194; 257/E29.246

(58) Field of Classification Search ......... 257/190, 257/192, 194–197, E29.246, E29.253; 438/162, 438/172

See application file for complete search history.

(56) References Cited

U.S. PATENT DOCUMENTS

| 4,873,205 | A | * | 10/1989 | Critchlow et al. | ......... 438/647 |
|---|---|---|---|---|---|
| 5,332,697 | A | | 7/1994 | Smith et al. | |
| 5,716,859 | A | | 2/1998 | Tajadod et al. | |
| 5,866,925 | A | | 2/1999 | Zolper et al. | |
| 5,981,986 | A | | 11/1999 | Tsuchiya | |
| 5,986,291 | A | | 11/1999 | Currie et al. | |
| 6,316,793 | B1 | | 11/2001 | Sheppard et al. | |
| 6,316,820 | B1 | | 11/2001 | Schmitz et al. | |
| 6,524,963 | B1 | * | 2/2003 | Zhou et al. | ................. 438/714 |
| 6,555,851 | B2 | | 4/2003 | Morizuka | |
| 6,617,261 | B2 | | 9/2003 | Wong et al. | |
| 6,803,289 | B1 | * | 10/2004 | Gopalan et al. | ............ 438/343 |
| 6,867,078 | B1 | | 3/2005 | Green et al. | |
| 6,995,032 | B2 | | 2/2006 | Bruhns et al. | |
| 7,052,942 | B1 | | 5/2006 | Smart et al. | |
| 7,192,626 | B2 | | 3/2007 | Dussarrat et al. | |
| 7,445,766 | B2 | | 11/2008 | Santini, Jr. et al. | |

(Continued)

FOREIGN PATENT DOCUMENTS

WO 03049176 A3 6/2003

(Continued)

OTHER PUBLICATIONS

Smith et al. ("High rate and selective etching of GaN, AlGaN, and AlN using an inductively coupled plasma", Appl. Phys. Lett. 71 (25), Dec. 22, 1997).*

(Continued)

*Primary Examiner*—Thao X Le
*Assistant Examiner*—William F Kraig
(74) *Attorney, Agent, or Firm*—Howard IP Law Group, PC

(57) ABSTRACT

A high electron mobility transistor including: a GaN material system based heterostructure; a passivating nitride layer over the heterostructure and defining a plurality of openings; and a plurality of electrical contacts for the heterostructure and formed through the openings.

14 Claims, 10 Drawing Sheets

U.S. PATENT DOCUMENTS

| | | |
|---|---|---|
| 2001/0009788 A1 | 7/2001 | Lipkin et al. |
| 2001/0013604 A1 | 8/2001 | Hase |
| 2002/0081864 A1* | 6/2002 | Zheng et al. ............... 438/791 |
| 2002/0105076 A1 | 8/2002 | Lin |
| 2002/0113848 A1 | 8/2002 | Anagnostopoulos et al. |
| 2002/0155691 A1 | 10/2002 | Lee et al. |
| 2003/0042850 A1 | 3/2003 | Bertram et al. |
| 2004/0029330 A1* | 2/2004 | Hussain et al. ............. 438/172 |
| 2004/0041169 A1 | 3/2004 | Ren et al. |
| 2004/0115478 A1 | 6/2004 | Qian et al. |
| 2004/0124435 A1 | 7/2004 | D'Evelyn et al. |
| 2004/0155260 A1 | 8/2004 | Kuzmik |
| 2004/0185643 A1 | 9/2004 | Chiyo et al. |
| 2004/0238842 A1 | 12/2004 | Micovic et al. |
| 2005/0087766 A1 | 4/2005 | Kikkawa |
| 2005/0179379 A1 | 8/2005 | Kim |
| 2005/0189651 A1 | 9/2005 | Hirose et al. |
| 2005/0199944 A1* | 9/2005 | Chen et al. ................. 257/324 |
| 2005/0258451 A1 | 11/2005 | Saxler et al. |
| 2005/0274977 A1 | 12/2005 | Saito et al. |
| 2006/0006414 A1 | 1/2006 | Germain et al. |
| 2006/0006415 A1 | 1/2006 | Wu et al. |
| 2006/0033094 A1 | 2/2006 | Campbell |

FOREIGN PATENT DOCUMENTS

| | | |
|---|---|---|
| WO | WO 03/049176 A2 | 6/2003 |
| WO | 2004025707 A3 | 3/2004 |

OTHER PUBLICATIONS

Schultz, R. J., Reactive Plasma Etching, VLSI Technology, Second Edition, pp. 184-231.

Adams, A.C., Dielectric and Polysilicon Film Deposition, VLSI Technology, Second Edition, pp. 233-271.

Ng et al., Complete Guide to Semiconductor Devices, John Wiley & sons, Inc., New York, 2002.

Chu, Rongming, AlGaN-GaN Single- and Double-Channel High Electron Mobility Transistors, Doctorate Thesis, The Hong Kong University of Science and Technology, Aug. 2004, Hong Kong, 100 pages.

Vetury, Ramakrishna, "Polarization Induced 2DEG in AlGanN/GaN HEMTs: On the origin, DC and transient characterization", Doctorate Thesis, University of California, Santa Barbara, Dec. 2000, 173 pages.

European Search report dated Oct. 15, 2009 for related EP application No. EP 06 74 0683.

Fan et al., AlGaN/GaN double heterostructure channel modulation doped field effect transistors (MODFETS), Electronics Letters, Apr. 1997, vol. 33, No. 9, pp. 814-815.

International Search Report dated Oct. 25, 2006 for related PCT Application No. PCT/US06/12955.

* cited by examiner ic
METHOD FOR MAKING GAN-BASED HIGH ELECTRON MOBILITY TRANSISTOR This application is a divisional application of copending U.S. patent application Ser. No. 11/100,672, entitled GaN-BASED HIGH ELECTRON MOBILITY TRANSISTOR AND METHOD FOR MAKING THE SAME, filed on Apr. 7, 2005, the entire disclosure of which is hereby incorporated as if being set forth in its entirety herein.

FIELD OF INVENTION

The present invention relates generally to transistors, and more particularly, to GaN based High Electron Mobility Transistors (HEMTs) and methods for making such transistors.

BACKGROUND

High Electron Mobility Transistors are known to be desirable in certain applications. One such application is microwave amplifiers. They are known to generally yield higher output power densities, lower noise figures, and be able to operate at higher frequencies as compared to other Field Effect Transistors (FETs). GaN material system based HEMT's are believed to be desirable for use in Radio Frequency (RF) modulation schemes and interfaces.

However, drain current reduction at high frequencies has conventionally limited the available output power in GaN material system-based HEMT devices, which is believed to be caused by the surface states. It is believed desirable to passivate the surface states and prevent surface damage during device processing. Low breakdown voltage has conventionally limited high drain biases for GaN material system based HEMT devices. It is believed desirable to increase the breakdown voltage. Further, the power performance of conventional GaN material system based HEMT devices typically degrades at high junction temperatures, due to reduced carrier saturation velocity and increased parasitic resistance. It is believed to be desirable to maintain a high two dimensional electron gas (2 DEG) mobility even at high temperatures. Repeatable low contact resistance in conventional GaN material system based HEMT devices has also proven problematic for high frequency operation. It is believed desirable to provide for repeatable and low contact resistances. It is also believed to be desirable to increase the 2 DEG sheet charge and maintain 2 DEG confinement to increase usable RF power and eliminate drain current reduction at high frequencies.

SUMMARY OF THE INVENTION

A high electron mobility transistor including: a GaN material system based heterostructure; barrier surface protection during MESA processing; a front end passivating dielectric layer over the heterostructure and defining a plurality of low damage etch processed openings for electrical ohmic contacts for source and drain electrodes and for Schottky contacts for gate electrodes on the heterostructure through the openings; ohmic contact opening surface treatments and source/drain ion implantation to reduce contact and source/drain resistance; and a double heterostructure for improved carrier confinement.

According to an aspect of the present invention, a method for making a high electron mobility transistor includes low pressure chemical vapor depositing a passivating nitride layer over a GaN material system based heterostructure; etching openings in the nitride layer; and forming electrodes through the openings.

BRIEF DESCRIPTION OF THE DRAWINGS

Understanding of the present invention will be facilitated by considering the following detailed description of the preferred embodiments of the present invention taken in conjunction with the accompanying drawings, in which like numerals refer to like parts, and.

DETAILED DESCRIPTION OF THE PREFERRED EMBODIMENTS

It is to be understood that the figures and descriptions of the present invention have been simplified to illustrate elements that are relevant for a clear understanding of the present invention, while eliminating, for the purpose of clarity, many other elements found in typical transistor systems and processing methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Figure 1:
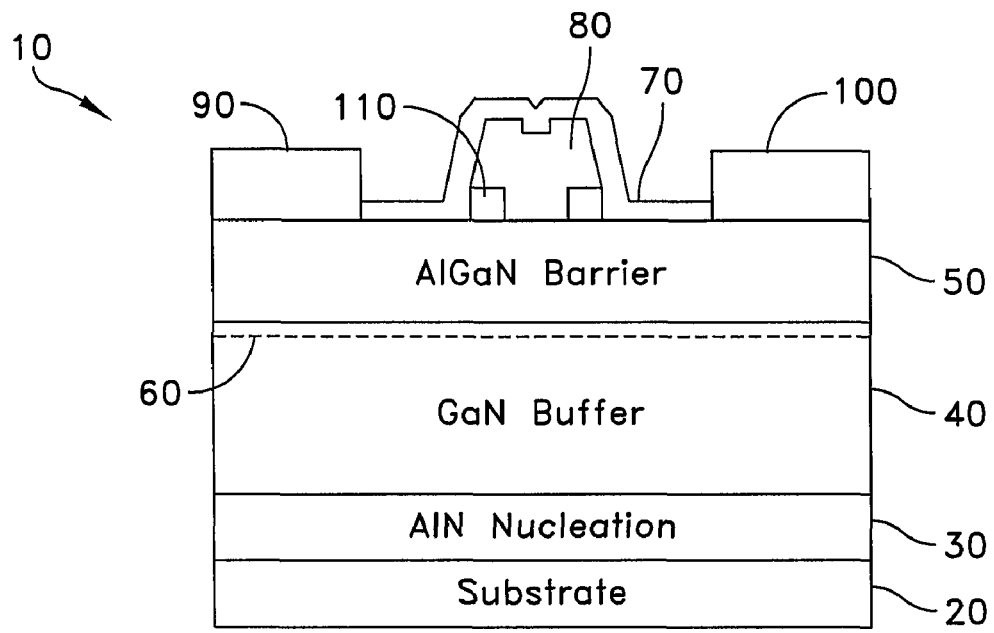
FIG. 1 illustrates a diagrammatic view of a HEMT.

Referring now to FIG. 1, there is shown a diagrammatic view of a High Electron Mobility Transistor (HEMT) device 10. Device 10 generally includes a substrate 20, an optional nucleation layer 30, buffer layer 40, barrier layer 50, 2 DEG region 60, and passivation layer 70. Device 10 also includes a T-gate 80, source 90 and drain 100. T-gate 80 may be laterally off-set towards source 90. For example, the lateral separation between T-gate 80 and source 90 may be on the order of about 0.5-2 µm (micrometer), preferably about 1 µm, while the lateral separation between T-gate 80 and drain 100 may be on the order of about 1-5 µm, and preferably about 2 µm.

Substrate 20 may take the form of a semi-insulating monocrystalline silicon carbide (SiC) substrate. SiC substrate 20 may be of a 4H or 6H polytype, for example. Substrate 20 may also take the form of a semi-insulating monocrystalline bulk GaN substrate, or may take the form of a sapphire substrate, or a semi-insulating monocrystalline AlN substrate, all by way of non-limiting example.

Nucleation layer 30 may take the form of an AlN, or a GaN, or an AlGaN layer; preferably a low-temperature AlN, nucleation layer where a 4H or 6H—SiC or sapphire substrate 20 is used. Nucleation layer 30 may optionally be omitted where substrate 20 takes the form of a bulk GaN or AlN substrate, for example.

Buffer layer 40 may take the form of a resistive GaN layer. Barrier layer 50 may take the form of an AlGaN layer. AlGaN barrier layer 50 may be Si doped or undoped, and preferably is undoped. Channel 60 represents a 2-dimensional electron gas (2 DEG) channel formed by the heterojunction between buffer layer 40 and barrier layer 50. The heterostructure may take the form of an AlGaN/GaN, or AlN/GaN heterostructure. A 2-Dimensional Electron Gas (2 DEG) forms at the interface between buffer layer 40 and barrier layer 50, i.e., channel 60, as a result of well known strong spontaneous polarization and piezoelectric polarization effects in GaN-based material systems. The resulting high density, high mobility AlGaN/GaN 2 DEG may be used to provide HEMT functionality when modulated by gate electrode 80.

Passivation layer 70 may take a conventional form where low temperature (400 deg. C.) plasma enhanced chemical vapor deposition (PECVD) passivation material is deposited after high temperature ohmic contact annealing and overlay and gate metallization processing have been completed. For example, passivation layer 70 may take the form of a surface film including $SiN_x$, AlN, $Sc_2O_3$, MgO or $SiO_2$.

Ohmic contacts/overlay metallization processing may be used to form source and drain electrodes 90, 100. Schottky metallization may be used to form T-gate electrode 80.

Figure 2:
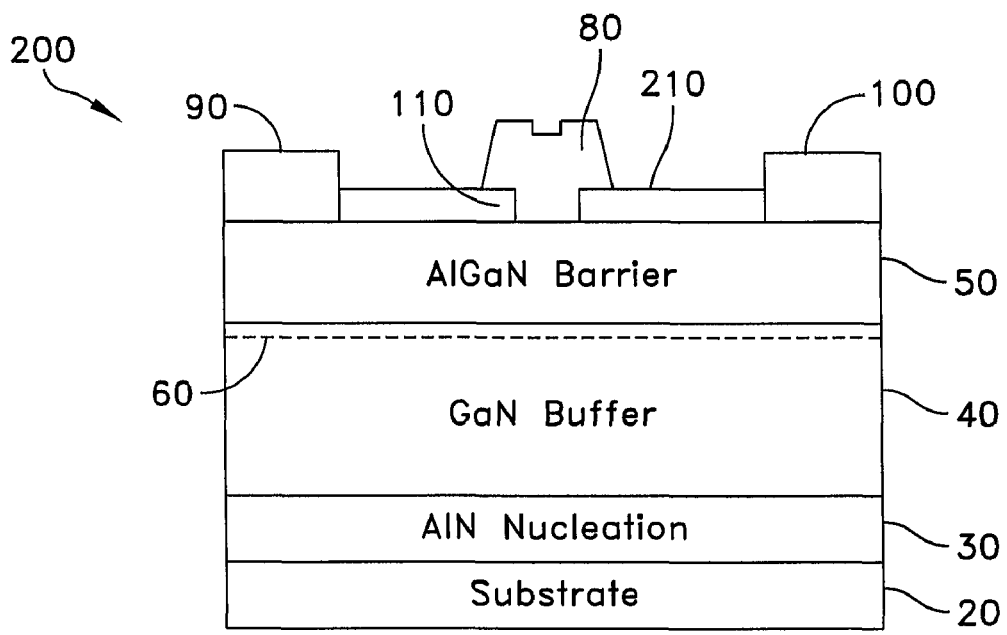
FIG. 2 illustrates a diagrammatic view of a HEMT according to an aspect of the present invention.

Referring now also to FIG. 2, there is shown a diagrammatic view of a "front end" field plate-type surface passivated High Electron Mobility Transistor (HEMT) device 200 according to an aspect of the present invention. Like numerals refer to like elements of the invention. Field plate-type passivation layer 210 provides for better surface coverage in regions 110 than does conventional passivation layer 70 because it is deposited early in the processing. This allows for stabilization of surface states in region 110. The extended passivation layer 210 under T-gate 80 may also provide for increased breakdown voltage as compared to passivation layer 70, by spreading the crowded electric field and modulating the surface states on the drain 100 side around T-gate 80.

According to an aspect of the present invention, a passivation layer, such as passivation layer 210, may be deposited relatively early during device processing. Passivation may occur prior to ohmic source or drain terminal contact, and gate formation. According to an aspect of the present invention, a passivation layer, such as passivation layer 210, may be deposited upon a GaN material system heterostructure using low pressure chemical vapor deposition (LPCVD) following mesa formation. For example, a heterostructure including layers 20-50 may be obtained via conventional commercial sources. Applying the passivation prior to ohmic contact and T-gate metallization processing allows the formation of a higher temperature/denser passivation layer, and allows passivation under the T-Gate extensions which is not the case for post gate passivation as shown in FIG. 1 region 110. The heterostructure, or wafer, may be cleaned, such as by using acetone, methanol and isopropanol dips. The wafer may then be rinsed and spin dried. Further cleaning, including a buffered oxide etch (BOE) and/or HF bath may also be used. The cleaned wafer may again be rinsed and dried. The cleaned wafer may then be subjected to a LPCVD process using $NH_3$ and $SiH_2Cl_2$ gases flowed at about 70 and 30 standard cubic centimeters per second (sccm) at about 765 degrees Celsius (deg. C.) and 370-460 millitorr (mT) to deposit $SiN_x$. Processing time may be appropriate for depositing a dense nitride passivation layer having a thickness of between about 450 and 2000 angstroms, for example. Passivation layer 210 may be suitable for use with a wide-variety of GaN material system based HEMTs.

Figure 3:
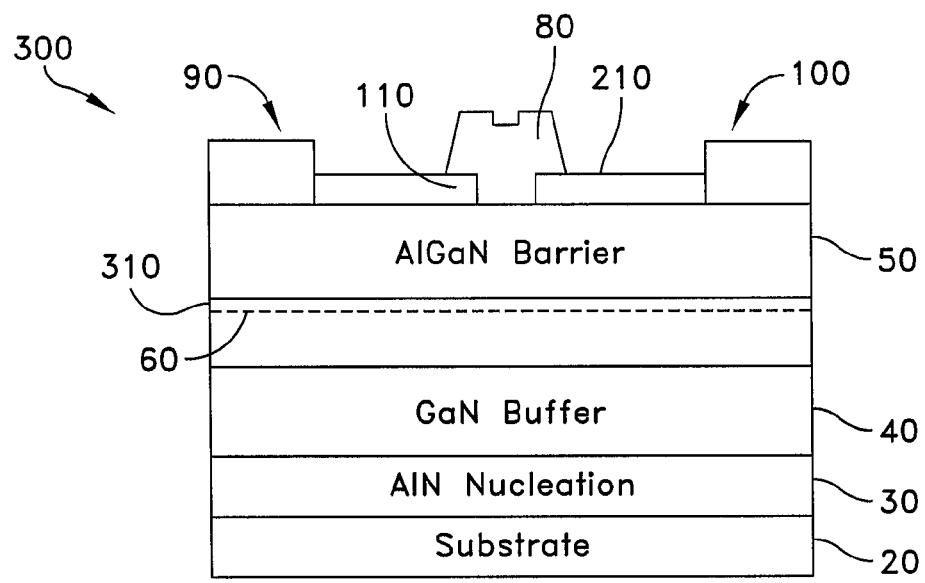
FIG. 3 illustrates a diagrammatic view of a HEMT according to an aspect of the present invention.

Referring now also to FIG. 3, there is shown a doped channel HEMT 300 according to an aspect of the present invention. Again, like numerals refer to like elements of the invention. HEMT 300 includes a doped channel 310. Channel 310 may include doped GaN or InGaN, by way of non-limiting example. Channel 310 may be between about 50 angstroms and 200 angstroms thick, and preferably about 100 angstroms, where barrier layer 50 is around 100 angstroms to 500 angstroms thick, and preferably about 200-300 angstroms thick. HEMT 300 may exhibit improved performance at high temperatures. Channel 310 may be n-type Si doped on the order of about $10^{16}$ to $10^{18}$ $cm^{-3}$. Channel 310 may be substantially uniformly doped. Layer 310 may be grown upon buffer layer 40. HEMT 300 performance may be relatively temperature independent, as compared with HEMT 10 or 200. This may result from the scattering mechanism being dominated in the doped channel 310 by impurity scattering, which is relatively temperature independent.

Figure 4:
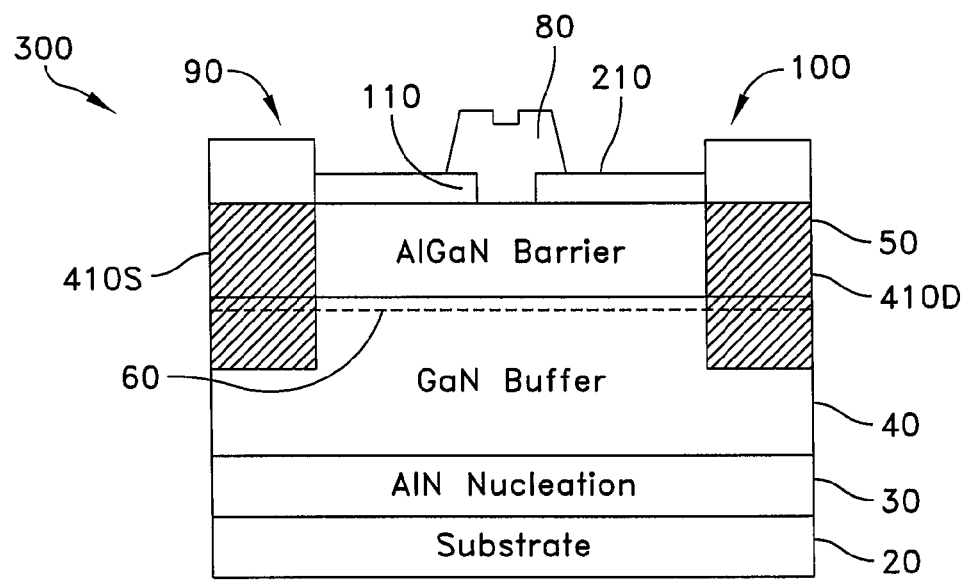
FIG. 4 illustrates a diagrammatic view of a HEMT according to an aspect of the present invention.

Referring now also to FIG. 4, there is shown a diagrammatic view of an HEMT 400 with implanted source and drain regions 410S, 410D, respectively, according to an aspect of the present invention. Again, like references refer to like elements of the invention. Source/drain implantation may serve to greatly increase conductivity under the source and drain metal electrodes, thus facilitating low contact resistances. Implanted regions 410S, 410D may be combined with a doped channel, such as channel 310 of FIG. 3. Implanted regions 410S, 410D may also be particularly well suited for use with a relatively thin, undoped AlN sub-barrier layer—which may otherwise hinder providing good, low resistance ohmic contacts. Aspects of forming implanted source and drain regions are detailed with respect to FIGS. 11A-11E.

Figure 5:
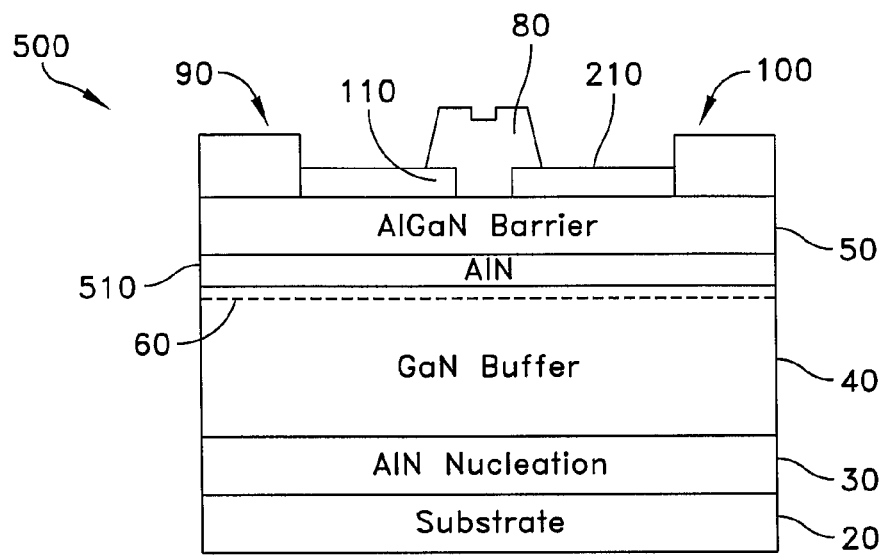
FIG. 5 illustrates a diagrammatic view of a HEMT according to an aspect of the present invention.

Referring now also to FIG. 5, there is shown a diagrammatic view of an HEMT 500 incorporating an AlN sub-barrier layer 510 according to an aspect of the present invention. Again, like references refer to like elements. Layer 510 may be relatively thin, on the order of about 10-20 angstroms, and be composed of undoped AlN. Layer 510 may serve to enhance the charge in the 2 DEG channel 60 and reduce the noise figure in HEMT 500. Again, layer 510 may be incorporated with a doped channel, such as channel 310 of FIG. 3, and/or implanted source and drain regions, such as regions 410S and 410D of FIG. 4.

Figure 6:
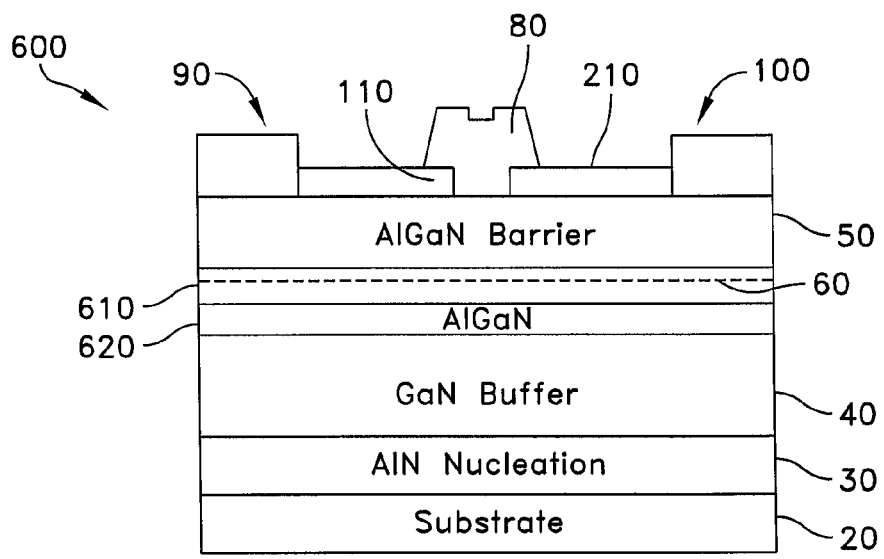
FIG. 6 illustrates a diagrammatic view of a HEMT according to an aspect of the present invention.

Referring now also to FIG. 6, there is shown a diagrammatic view of a double heterostructure HEMT 600 according to an aspect of the present invention. Again, like references designate like elements of the invention. HEMT 600 includes a channel layer 610. Channel 610 may take the form of un-doped GaN or InGaN, by way of non-limiting example only. In such an embodiment, HEMT 600 takes the form of an AlGaN/(In)GaN/AlGaN double heterostructure HEMT to provide a better carrier confinement in the channel 610. Channel 610 may be around 50 angstroms to 200 angstroms thick, preferably about 100 angstroms, where layer 50 is around 100 angstroms to 500 angstroms thick and preferably about 200-300 angstroms thick. Layer 620 may be undoped, or doped with Fe or other elements to provide semi-insulating properties. Layer 620 may be about 50 angstroms to 5000 angstroms thick, preferably about 100-500 angstroms.

Figure 7:
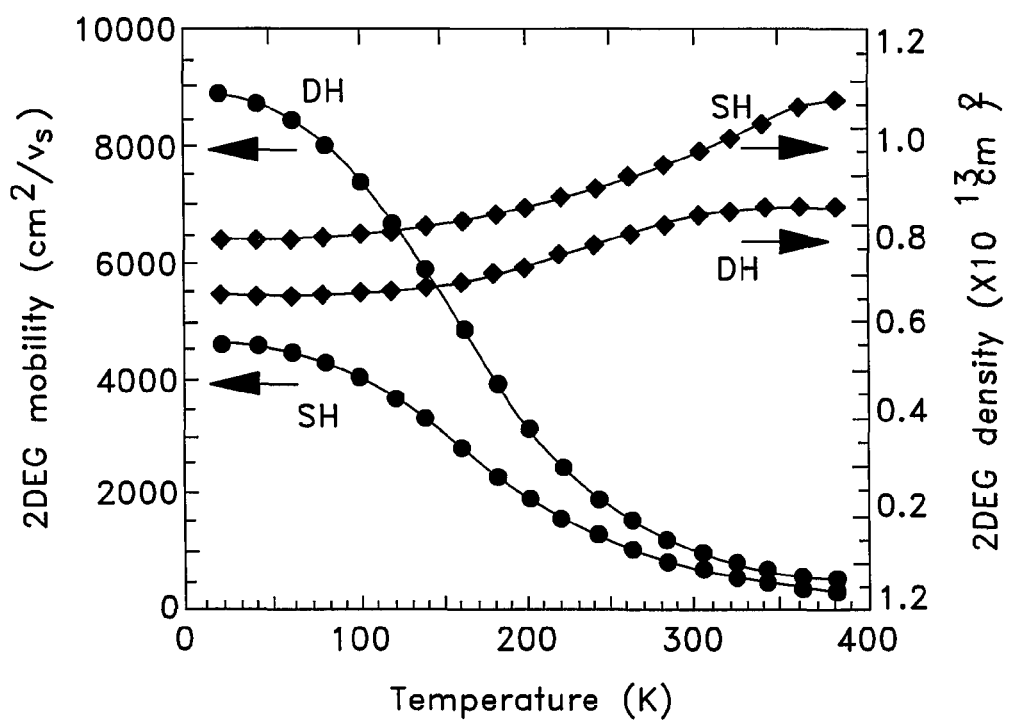
FIG. 7 illustrates performance characteristics according to an aspect of the present invention.

Referring now also to FIG. 7, there are shown some characteristics of a double heterostructure HEMT, such as HEMT 600 of FIG. 6, and a single heterostructure HEMT. As is shown therein, a double heterostructure HEMT may exhibit a higher channel mobility compared to other HEMT structures. Also, a double heterostructure HEMT may exhibit a lower 2 DEG sheet density as compared to other HEMT structures.

Figure 8:
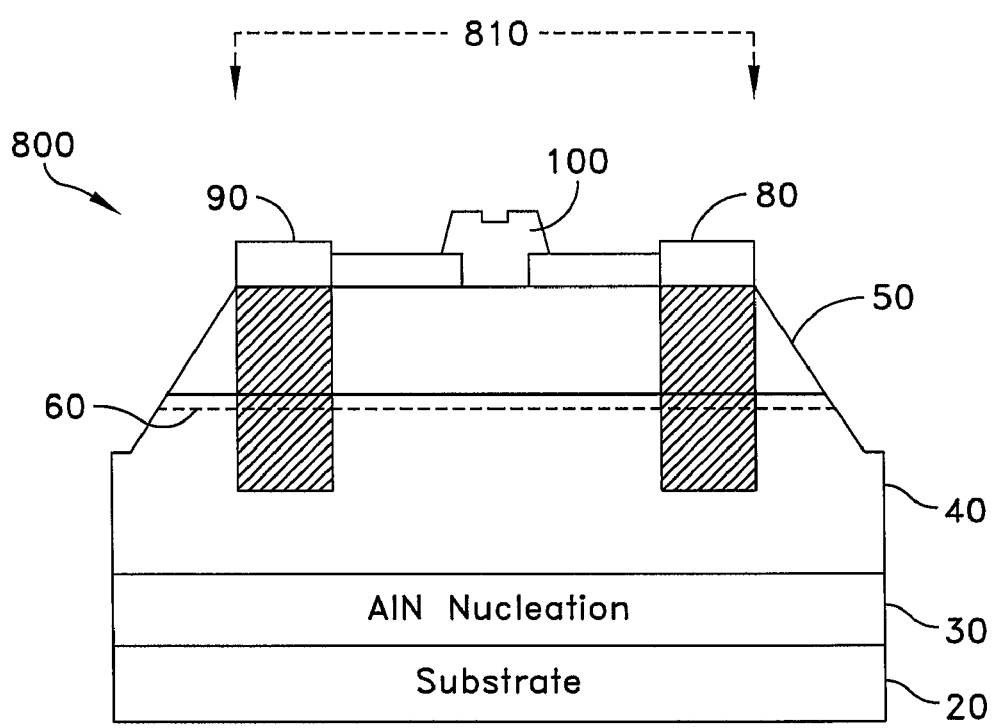
FIG. 8 illustrates a diagrammatic view of a HEMT according to an aspect of the present invention.

According to an aspect of the present invention, an HEMT device, such as any of devices 10, 200, 300, 400, 500 and 600 may be formed into devices including sloped mesas. The shaping of HEMT devices to include a sloped mesa may better isolate such devices, improve device manufacturing yields, and improve long-term device reliability, for example. Referring now to FIG. 8, there is shown a device 800 according to an aspect of the present invention. As will be understood by those possessing an ordinary skill in the pertinent arts, the structure of illustrated device 800 largely corresponds to a mesa structure of device 400 for non-limiting purposes of illustration only. Device 800 includes a sloped mesa. Again, like references identify like elements of the invention. Gate 80, drain 90 and source 100 are positioned on the mesa plateau portion 810 of layer 50. The mesa etch may terminate in the GaN Buffer layer 40, and have a MESA etch depth of about 2000 angstroms compared to a barrier layer 50 thickness of about 200 angstroms.

According to an aspect of the present invention, GaN material system heterostructures may be formed into mesa-formed HEMT devices with the assistance of one or more protecting layers to minimize the potential of surface damage to the sensitive barrier layer. A GaN material system heterostructure suitable for use may take the form of a wafer having a layer structure consistent with any one of structures 200-600, absent passivation layers, gates, sources and drains, for example.

Figure 9A:
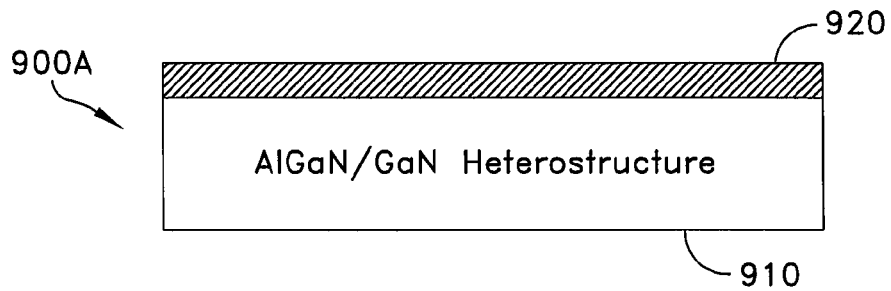
FIGS. 9A-9D illustrate diagrammatic views of an AlGaN/GaN heterostructure during different processing steps according to an aspect of the present invention.

Referring now also to FIGS. 9A-9D, there are shown structures 900A-900D at various processing steps according to an aspect of the present invention. Prior to processing, a GaN material system heterostructure wafer, hereinafter referred to simply as a wafer, may be cleaned using acetone, methanol and isopropyl alcohol dips, and subsequent rinsing and spin drying, for example. According to an aspect of the present invention, a dielectric film may be used to mitigate photo resist removal damage that may otherwise occur during mesa formation. Referring first to FIG. 9A, there is shown a structure 900A. Illustrated structure 900A includes an AlGaN/GaN heterostructure 910. Such a structure is analogous to that shown in FIGS. 1-6, absent T-gate 80, source 90, drain 100 and passivation layer 70, 210. Dielectric film 920 may be low temperature chemical vapor deposited oxide (PECVD or Low temperature CVD deposited) over structure 910. Film 920 may take the form of a thin layer (about 1000 angstroms or less) of silicon dioxide ($SiO_2$), for example.

Figure 9B:
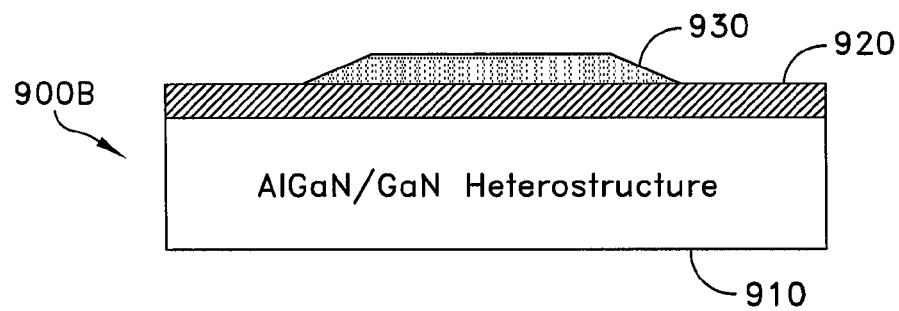

Oxide film 920 may be formed by flowing $SiH_4$ and $O_2$ at rates of about 43 sccm and 90 sccm, respectively, at a pressure of about 260 mT and a temperature of about 440 deg. C. Film 920 may serve as a protection layer for the AlGaN barrier surface during mesa etching and subsequent etch mask removal. Temperatures may rise significantly during mesa etching resulting in hardening of the resist masking layer 930 (FIG. 9B). This may render the photo resist on the structure difficult to remove. Layer 920 protects the barrier layer surface during resist removal, and thus facilitates plasma ashing to remove photoresist from structure 910. Direct exposure of the AlGaN barrier to plasma ashing has been shown to damage the barrier layer and reduce or remove the 2 DEG in the channel.

Referring now also to FIG. 9B, there is shown a structure 900B. Structure 900B additionally includes a patterned photoresist layer 930. Layer 930 may be composed of a commercially available photoresist, such as AZ4400 available from Shipley, for example. Layer 930 may be patterned in the form of a mesa mask using conventional methodologies, such as spin coating, exposing, developing and reflowing, for example.

Figure 9C:
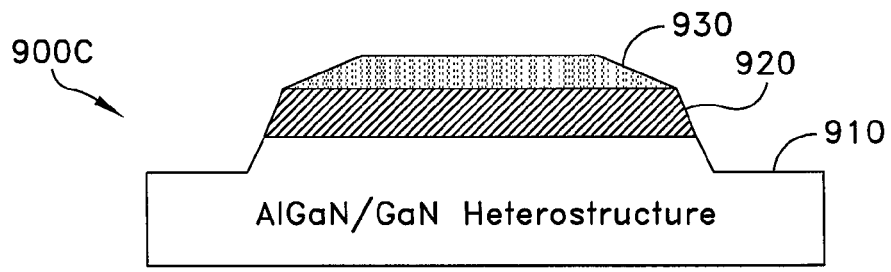

Referring now also to FIG. 9C, the patterned mask layer 930 may be suitable for facilitating shaping of layer 920 and structure 910 into a mesa structure 900C. For example, a reactive ion etch (RIE) may be used to remove portions of layer 920 dependently upon mask layer 930. A GaN layer within structure 910 may serve as an etch stop for a $NF_3$/Ar etch flowed at about 12/28 sccm, respectively, at about 100 mT and 400 watts (W) using a carbon plate. Referring still to structure 900C, a diluted oxide etch, such as an etch using a diluted HF etchant, may then be used to clean the GaN surface exposed by the reactive ion etch. Referring still to structure 900C, a high density, Inductively Coupled Plasma (ICP) etch may be used to form the GaN layer into the desired mesa shape. $BCl_3$ and $Cl_2$ gases may be flowed at rates of 10 sccm and 30 sccm during ignition and 15 sccm and 30 sccm during etching, respectively. RF power used may be around 50 W and 300 W during ignition and 15 W (using a 90 v bias) and 300 W during etching. The etching may be carried out at around 5 mT and about 10 deg. C. Etch depth can range from 1000-3000 Angstroms, for example.

Figure 9D:
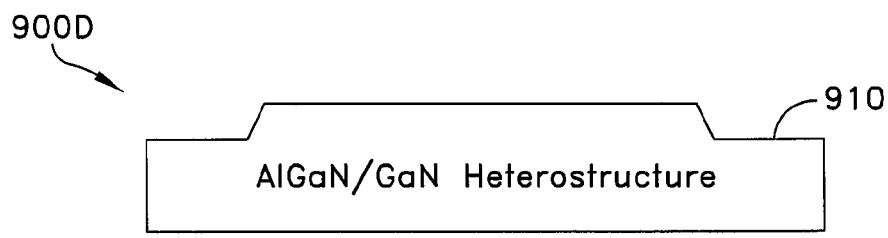

Referring now also to FIG. 9D, patterned layer 930 and the remaining portions of layer 920 may then be selectively removed to provide mesa shaped structure 900D. For example, an $O_2$ ashing or descum process may be carried out to remove densified resist. Processing may include an acetone bath and propanol rinse. Another ashing or descum process may then be effected, to better ensure all resist has been removed. Dielectric layer 920 remains over the barrier layer for protection during this removal step. A wet oxide etch may then be used to remove the remaining layer 920. A dilute HF etchant (such as on the order of about 1:20) may be used at room temperature. The mesa shaped wafer may then again be cleaned, such as by using a photo resist stripping bath, for example. The use of layer 920 may serve to protect the relatively fragile channel area of structure 910 during the aforementioned processing over which the gate, and source and drain electrodes will be formed.

Structure 900D may be provided with a T-gate 80, source 90, drain 100 and passivation layer 210 to provide a device analogous to device 800 of FIG. 8, for example—absent doped regions.

Figure 10A:
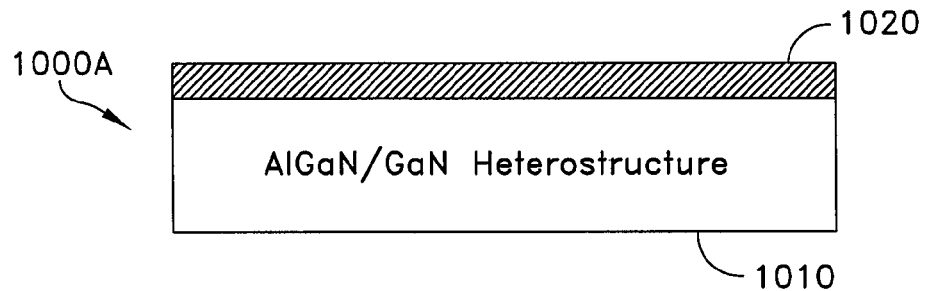
FIGS. 10A-10C illustrate diagrammatic views of an AlGaN/GaN heterostructure during different processing steps according to an aspect of the present invention.
Figure 10B:
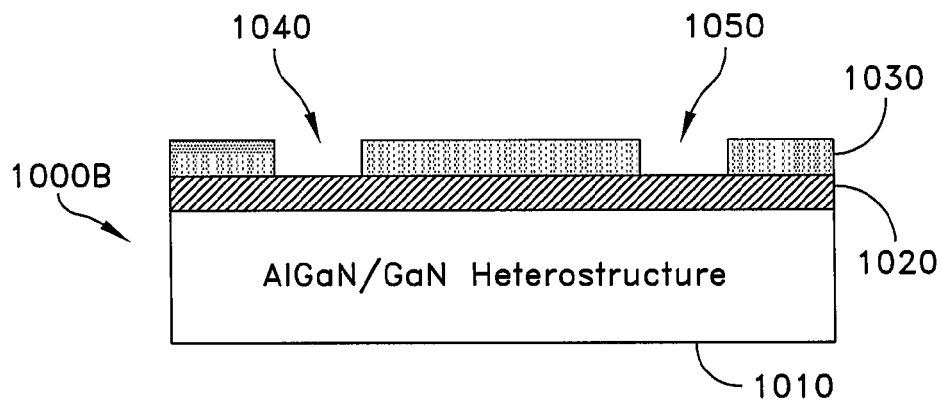
Figure 10C:
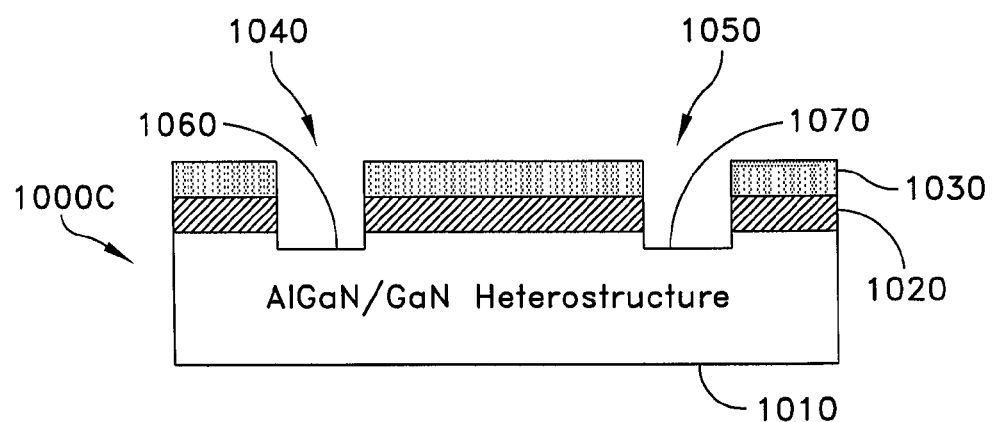

Referring now also to FIGS. 10A-10C, according to an aspect of the present invention, ohmic contact openings for the source and drain regions may be plasma treated prior to ohmic contact metallization. An HEMT structure to be plasma treated in accordance with the present invention may take the form of one of structures 100-600 of FIGS. 1-6, or 800 of FIG. 8. Plasma treating AlGaN/GaN heterostructure ohmic contact openings immediately prior to ohmic contact metallization may lower the ohmic contact resistance by creating a near-surface conducting layer with N-vacancies. It may also serve to clean the structure prior to contact metallization. It may also improve the ohmic metal surface morphology after Rapid Thermal Annealing (RTA) by creating microscopic surface features. Illustrated structure 1000A includes an AlGaN/GaN heterostructure 1010, such as a structure analogous to structure 900D shown in FIG. 9D (only the mesa plateau is shown). Illustrated structure 1000A also includes a surface passivating layer 1020. Layer 1020 may take the form of a $SiN_x$ layer that has been formed over heterostructure 1010 using high temperature, densified LPCVD, as in one of structures 100-600 of FIGS. 1-6, or 800 of FIG. 8. Layer 1020 may also be formed using plasma enhanced chemical vapor deposition (PECVD), or evaporation, for example. Layer 1020 may take the form of an AlN film formed on structure 1010 using molecular beam expitaxy (MBE) or sputtering, $Sc_2O_3$, MgO using MBE, or $SiO_2$ using LPCVD or PECVD. Layer 1020 may take the form of a combination of these layers as well, for example.

Referring now also to FIG. 10B, structure 1000B includes a patterned photoresist layer 1030 over protection or passivation layer 1020. Layer 1030 may have openings 1040, 1050 corresponding to ohmic contact regions to layer 1010, such as those corresponding to source 90 and/or drain 100 (FIG. 8), for example. Structure 1000B may be subjected to a selective etch well suited for removing portions of layer 1020 exposed by openings 1040, 1050 in layer 1030. For example, structure 1000B may be subjected to a wet etch such as dilute HF or buffered oxide etch (BOE). A plasma etch may also be used for etching. Layer 1020, which may be akin to layer 210 and take the form of a dense $SiN_x$, may be etched using an inductively coupled plasma (ICP) etch, for example. $SF_6$ gas may be flowed at rates of 30 sccm during ignition and etching. RF powers used may be around 50 W and 600 W during ignition and 5 W and 600 W during etching. The etching may be carried out at around 20 mT and at about 10 deg. C. The resulting structure 1000C of FIG. 10C may then be subjected to an ICP etch prior to ohmic contact metallization deposition. This ICP etch may be selected to remove less than around 50 angstroms of the barrier layer of the heterostructure 1010, to better ensure an ohmic contact formation during metallization deposition and anneal. $BCl_3$ and $Cl_2$ gases may be flowed at rates of 15 and 30 sccm, and RF power used may be around 40 W. The etch may be carried out for about 20-60 seconds at around 5 mTorr. at about 10 deg. C. $N_2$ gas may also be used at flow rates of 15 sccm. RF powers used may be around 40 W for RF source and 300 W for ICP source. The etch may be carried out for about 30-60 seconds at around 3 mTorr. at about 10 deg.

Referring now also to FIG. 10C, regions 1060, 1070 may have N-vacancies created in heterostructure 1010 by the ICP etch treatment. Regions 1060, 1070 of structure 1010 correspond to openings 1040, 1050. Regions 1060, 1070 may correspond to ohmic contact regions for source and drain electrodes providing for improved device performance due to reduced ohmic contact resistances for source and drain electrodes. Photo resist 1030 may be removed analogously to the photo resist removal discussed with regard to FIGS. 9A-9D. Remaining portions of layer 1020 may be utilized as surface passivation, analogous to layer 210 of FIG. 4, or the layer may be removed and replaced. Alternatively, one or more of layers 1020, 1030 may be used as a lift off material for one or more metallization layers deposited to form ohmic contacts for the source and drain electrodes (e.g. layer 1195 of FIG. 11D). For example, standard Ti—Al—Ti—Au, Ti—Al—Mo—Au, Ti—Al—Ni—Au, or Ti—Al—Pt—Au metallization stacks may be used. After ICP pre-cleaning, an optional pre-ohmic contact metal deposition cleaning of the exposed portions of regions 1060 and 1070 may be used to insure any native oxide is removed. For example, $O_2$ ashing and a wet diluted and buffered oxide etch may be used. As will be understood by those possessing an ordinary skill in the pertinent arts, an RTA anneal at between 750 deg. C. and 850 deg. C. may be performed following ohmic contact metal liftoff processing to complete the formation of the ohmic contacts.

Figure 11A:
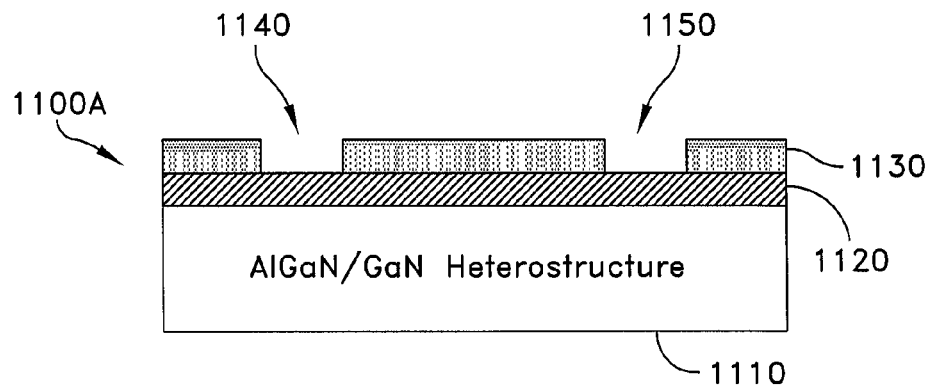
FIGS. 11A-11E illustrate diagrammatic views of an AlGaN/GaN heterostructure during different processing steps according to an aspect of the present invention.
Figure 11B:
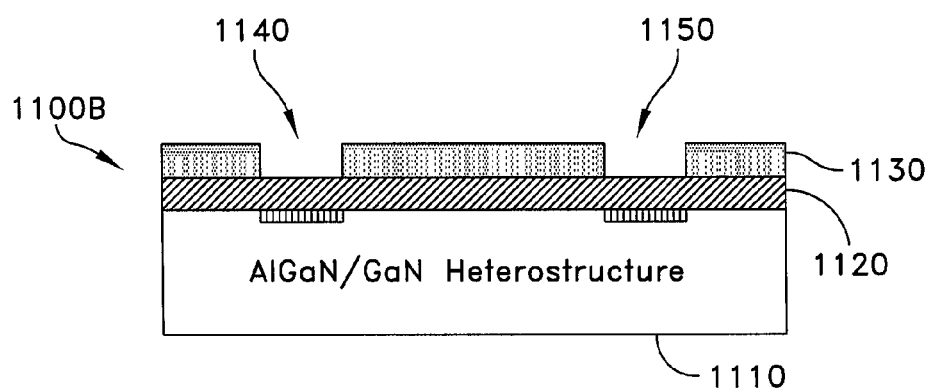
Figure 11C:
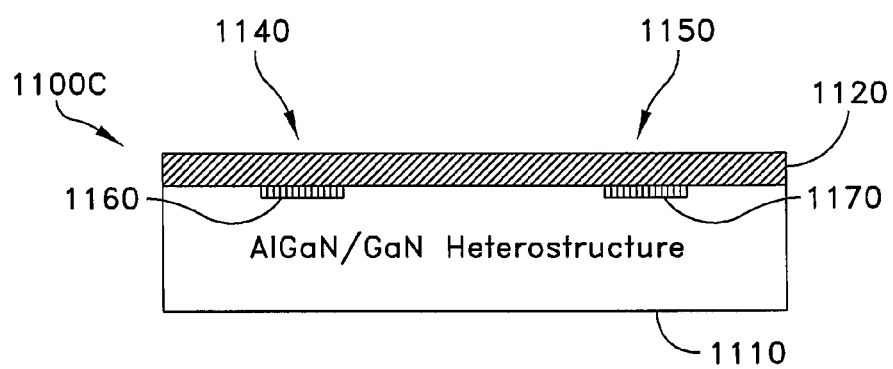

Referring now also to FIG. 11A, structure 1100A is akin to structure 1000B of FIG. 10B. A further embodiment to reduce source drain resistance is to ion implant the source and drain regions prior to ohmic contact formation. Such a method may implant $Si^+$ or $Ge^+$ or co-implant $Si^+$ and $N^+$ or $Ge^+$ and $N^+$ into portions of the heterostructure 1110 exposed through openings 1140 and 1150 in FIG. 11B formed in an analogous fashion to openings 1040 and 1050 in FIG. 10C. Layer 1130 may be a thick photoresist or a metal mask to block the implant. Layer 1120 may take the form of AlN to facilitate protection of the AlGaN/GaN heterostructure from damage during implant annealing. Implanted regions 1160 and 1170 in FIG. 11C may be thermally activated between about 1000 deg. C. and 1300 deg. C. with an AlN mask. The photoresist or metal mask may be removed from the wafer prior to annealing. According to an aspect of the present invention, RTA may be used to activate the dopant. Referring now also to FIG. 11C, the AlN anneal protection layer may be retained as the passivation layer, or it may be removed and replaced by LPCVD silicon nitride.

Figure 11D:
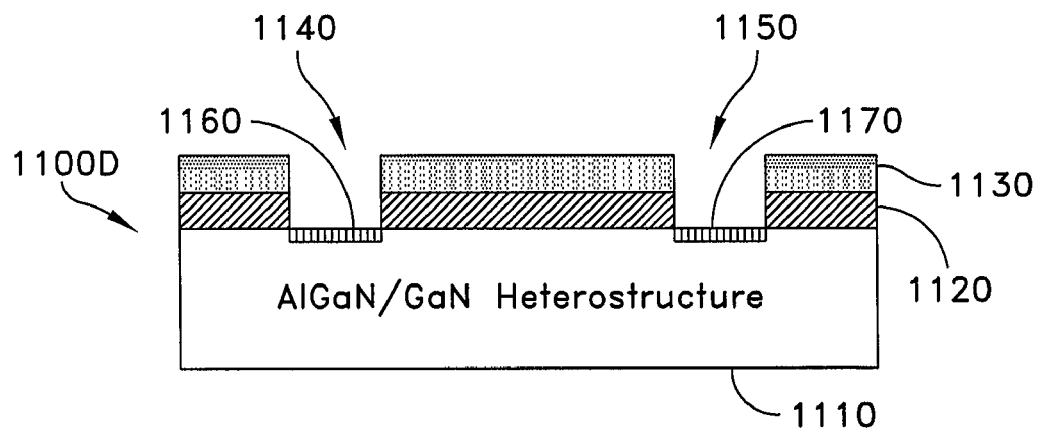
Figure 11E:
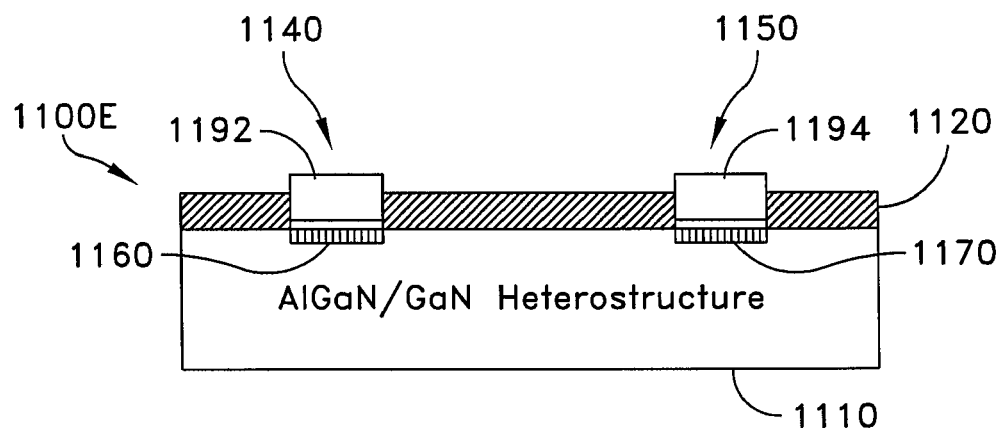

Referring now also to FIGS. 11D and 11E, ohmic contacts to layer 1110 through openings 1140, 1150 in passivation layer 1120 corresponding to source and drain implanted regions may be provided. A photo resist layer 1130 may be reapplied over passivation layer 1120, analogously to the photo resist layers discussed hereinabove. Photo resist layer 1130 may be patterned to reopen openings in passivation layer 1020 corresponding to previously implanted source and drain regions. Passivation layer 1020 openings are then ready for removal of the AlN to the AlGaN/GaN Heterostructure surface. The exposed portions of the 1110 surface (ohmic contact openings) may be cleaned followed by ohmic contact metal deposition, liftoff processing and annealing as discussed previously. Standard liftoff lithography and metallization steps may be then used to provide source and drain electrodes 1192 and 1194 shown in FIG. 11E. For example, a Ti—Ni—Au source/drain metallization may be used.

The resulting device 1100E may include a heterostructure 1110 including doped regions 1160, 1170, and passivation layer 1120, and be largely analogous to the form of device 400 of FIG. 4 or 800 of FIG. 8, absent ohmic contacts and source, drain and gate metallization, by way of non-limiting example only.

Referring now also to FIGS. 12A-12D, there are shown structures 1200A-1200D that represent various processing steps according to an aspect of the present invention. Structure 1200D may take the form of a HEMT according to an aspect of the present invention, including drain and source electrodes 1192, 1194 (that may be akin to drain and source 90, 100 of FIG. 2), and a gate electrode 1298 (that may be akin to gate 80 of FIG. 2). Structure 1200A of FIG. 12A may be analogous to structure 1100A of FIG. 11A, but in this case the opening in the photo resist is in the gate metallization region. Photo resist layer 1230 may take the form of a PMMA, for example. Layer 1230 may take the form of a 495 PMMA, for example. Layer 1230 may be spin coated onto structure 1100E, for example. Layer 1230 may be well suited for use as a processing mask for gate dielectric opening and gate electrode 1298 liftoff formation, for example.

Figure 12A:
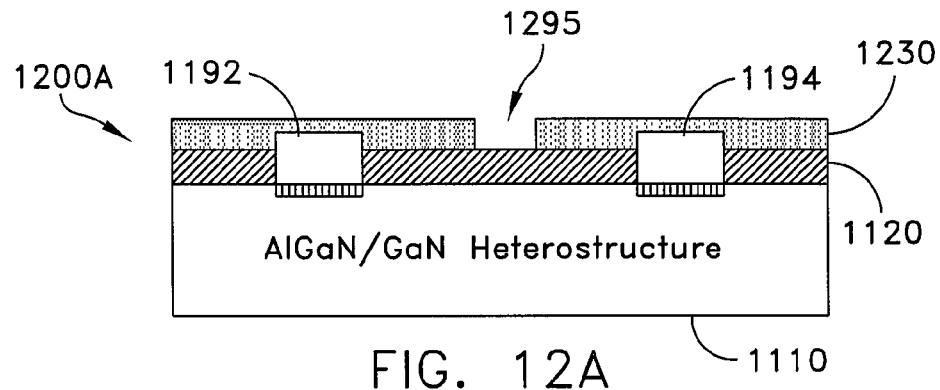
FIGS. 12A-12D illustrate diagrammatic views of an AlGaN/GaN heterostructure during different processing steps according to an aspect of the present invention.
Figure 12B:
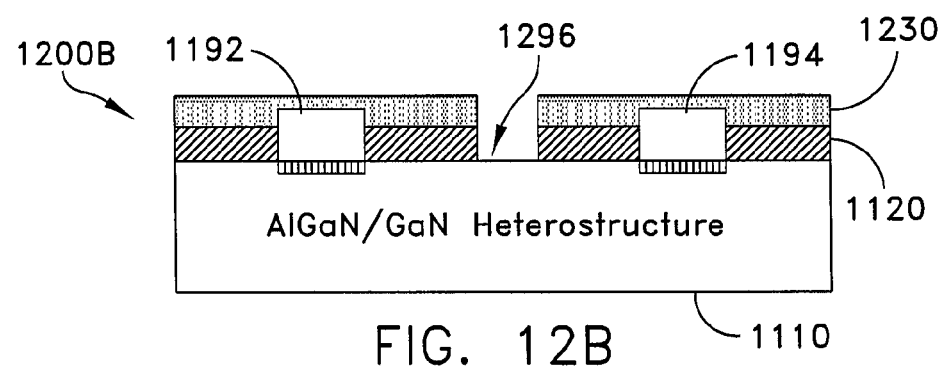

Referring now to FIG. 12A, an opening 1295 may be formed in layer 1230 by e-beam exposure and developing as is shown in structure 1200A. The position and dimensions of opening 1295 may largely correspond to the position and footprint dimensions of gate 1298 through passivation layer 1120. Developer utilized may include MIBK:IPA. A developer may also be used to remove remaining portions of PMMA layer 1230. Referring now also to FIG. 12B, as shown in structure 1200B, etching may be used to remove portions of layer 1120 corresponding to opening 1295. A reactive ion etch (RIE) may be used for example. A PT-72 RIE machine may be operated at about 0.04 mT, with a flow of 70 sccm $CF_4$ at about 150 W. The barrier surface 1296 exposed in FIG. 12B is sensitive to RIE exposure and such exposure can reduce the 2 DEG in the channel. The RIE conditions may be selected to minimize 2 DEG reduction. In addition, a rapid thermal anneal (RTA) process may be used to remove the ion damage from RIE plasma etch.

Figure 12C:
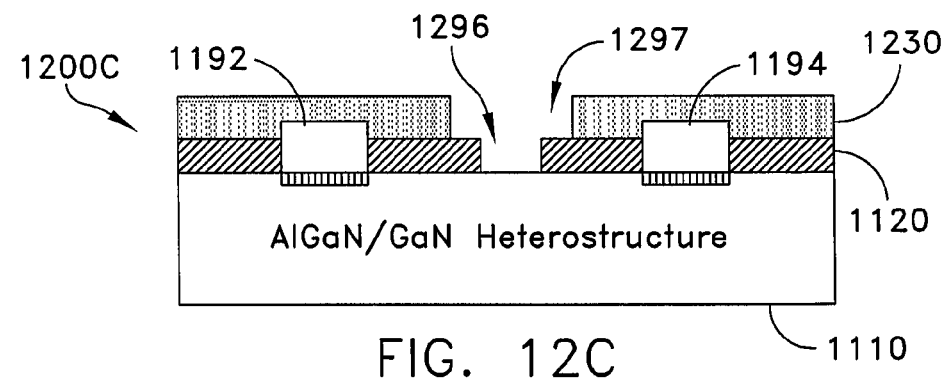
Figure 12D:
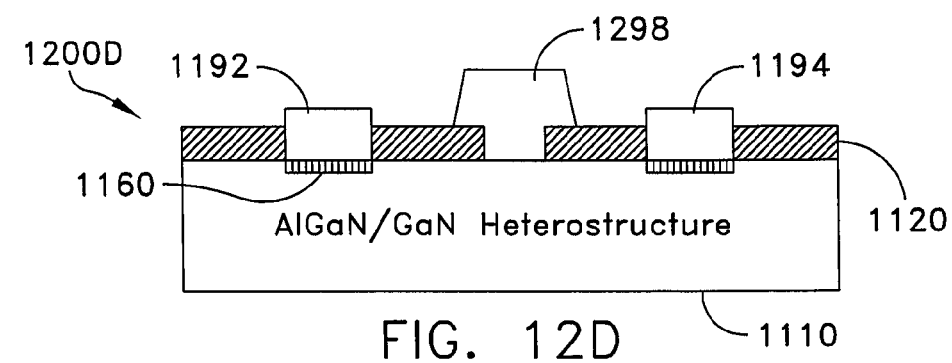

Referring now also to FIG. 12C, a PMMA has been reapplied to the wafer in structure 1200C such that the post develop opening 1297 overlaps the gate footprint opening 1296. Gate metal deposition and subsequent liftoff processing may be used, resulting in the HEMT structure 1200D shown in FIG. 12D. The preferred gate metallization is Ni/Pt/Au, with a total thickness of between about 0.4 and 0.8 μm.

While the foregoing invention has been described with reference to the above, various modifications and changes can be made without departing from the spirit of the invention. Accordingly, all such modifications and changes are considered to be within the scope of the appended claims.

What is claimed is:

1. A method for making a high electron mobility transistor comprising:
   providing a dielectric film over a GaN material system based heterostructure;
   providing a photo resist mask over said dielectric film;
   etching said dielectric film and heterostructure dependently upon said photo resist mask into a mesa structure;
   removing said photo resist mask and remaining portions of said dielectric film;
   low pressure chemical vapor depositing a dense passivating nitride layer onto the GaN material system based heterostructure, wherein the low pressure chemical vapor deposited passivating nitride layer is on the mesa structure,
   etching openings in said nitride layer; and
   forming electrodes in contact with the GaN material system based heterostructure and through said openings.

2. The method of claim 1, wherein said low pressure chemical vapor depositing comprises flowing $NH_3$ and $SiH_2Cl_2$.

3. The method of claim 2, wherein said $NH_3$ and $SiH_2Cl_2$ are flowed at a ratio of about 7:3 sccm to form a dense nitride layer having a thickness of between about 450 and 2000 angstroms.

4. The method of claim 2, wherein said flowing is at a temperature less than about 800 degrees Celsius.

5. The method of claim 1, wherein said forming electrodes comprises metal evaporation.

6. The method of claim 1, wherein said etching openings comprises providing a photo resist mask over said dense nitride layer, reactive ion etching said dense nitride layer through said photo resist mask and inductive coupled plasma etching said heterostructure through said photo resist mask.

7. A method for making a high electron mobility transistor comprising:
   providing a dielectric film over a GaN material system based heterostructure;
   providing a photo resist mask over said dielectric film;
   etching said dielectric film dependently upon said photo resist mask to provide openings to said heterostructure;
   plasma treating said heterostructure through said openings;
   removing said photo resist mask and remaining portions of said dielectric film;
   low pressure chemical vapor depositing a dense passivating nitride layer onto the GaN material system based heterostructure;
   etching openings in said nitride layer; and
   forming electrodes in contact with the GaN material system based heterostructure and through said openings.

8. The method of claim 7, wherein said plasma treating causes N-vacancies to be formed in said heterostructure.

9. The method of claim 7, further comprising prior to the low pressure chemical vapor depositing the passivating nitride layer:
   providing another dielectric film over the GaN material system based heterostructure;
   providing another photo resist mask over said dielectric film;
   etching said other dielectric film and heterostructure dependently upon said other photo resist mask into a mesa structure; and removing said other photo resist mask and remaining portions of said other dielectric film;
wherein the low pressure chemical vapor deposited passivating nitride layer is on the mesa structure.

10. The method of claim 7, wherein said low pressure chemical vapor depositing comprises flowing $NH_3$ and $SiH_2Cl_2$.

11. The method of claim 10, wherein said $NH_3$ and $SiH_2Cl_2$ are flowed at a ratio of about 7:3 sccm to form a dense nitride layer having a thickness of between about 450 and 2000 angstroms.

12. The method of claim 10, wherein said flowing is at a temperature less than about 800 degrees Celsius.

13. The method of claim 7, wherein said forming electrodes comprises metal evaporation.

14. The method of claim 7, wherein said etching openings comprises providing a photo resist mask over said dense nitride layer, reactive ion etching said dense nitride layer through said photo resist mask and inductive coupled plasma etching said heterostructure through said photo resist mask.

* * * * *